(12) United States Patent
Choi et al.

(10) Patent No.: US 11,264,339 B2
(45) Date of Patent: Mar. 1, 2022

(54) METHOD OF MANUFACTURING CONNECTION STRUCTURE OF SEMICONDUCTOR CHIP AND METHOD OF MANUFACTURING SEMICONDUCTOR PACKAGE

(71) Applicant: SAMSUNG ELECTRONICS CO., LTD., Suwon-si (KR)

(72) Inventors: Gyujin Choi, Suwon-si (KR); Sunghoan Kim, Suwon-si (KR); Changeun Joo, Suwon-si (KR); Chilwoo Kwon, Suwon-si (KR); Youngkyu Lim, Suwon-si (KR); Sunguk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 16/703,239

(22) Filed: Dec. 4, 2019

(65) Prior Publication Data
US 2020/0273817 A1    Aug. 27, 2020

(30) Foreign Application Priority Data

Feb. 25, 2019   (KR) .................. 10-2019-0022013

(51) Int. Cl.
*H01L 23/00*   (2006.01)
*H01L 21/66*   (2006.01)
(Continued)

(52) U.S. Cl.
CPC ........ *H01L 23/564* (2013.01); *H01L 21/4853* (2013.01); *H01L 21/565* (2013.01);
(Continued)

(58) Field of Classification Search
None
See application file for complete search history.

(56) References Cited

U.S. PATENT DOCUMENTS 8,324,733 B2 * 12/2012 Lee .................. H01L 25/18
257/774
2010/0252935 A1 * 10/2010 Lee .................. H01L 21/76898
257/774

(Continued)

FOREIGN PATENT DOCUMENTS

KR    10-1892876 B1    8/2018

*Primary Examiner* — Long Pham
(74) *Attorney, Agent, or Firm* — Sughrue Mion, PLLC (57) ABSTRACT

The method of manufacturing a connection structure of a semiconductor chip includes: preparing a semiconductor chip having a first surface having a connection pad disposed thereon and a second surface opposing the first surface and including a passivation layer disposed on the first surface and covering the connection pad; forming an insulating layer on the first surface of the semiconductor chip, the insulating layer covering at least a portion of the passivation layer; forming a via hole penetrating through the insulating layer to expose at least a portion of the passivation layer; exposing at least a portion of the connection pad by removing the passivation layer exposed by the via hole; forming a redistribution via by filling the via hole with a conductive material; and forming a redistribution layer on the redistribution via and the insulating layer.

14 Claims, 9 Drawing Sheets

(51) Int. Cl.
*H01L 21/48* (2006.01)
*H01L 21/56* (2006.01)
*H01L 23/31* (2006.01)
*H01L 23/538* (2006.01)

(52) U.S. Cl.
CPC .......... *H01L 22/12* (2013.01); *H01L 23/3128* (2013.01); *H01L 23/5386* (2013.01); *H01L 23/5389* (2013.01); *H01L 24/02* (2013.01); *H01L 24/03* (2013.01); *H01L 24/05* (2013.01); *H01L 24/19* (2013.01); *H01L 24/20* (2013.01); *H01L 2224/0236* (2013.01); *H01L 2224/02311* (2013.01); *H01L 2224/02379* (2013.01); *H01L 2224/037* (2013.01); *H01L 2224/0346* (2013.01); *H01L 2224/0401* (2013.01); *H01L 2224/05008* (2013.01); *H01L 2224/05124* (2013.01); *H01L 2224/214* (2013.01)

(56) References Cited

U.S. PATENT DOCUMENTS

2012/0119371 A1\* 5/2012 Matsumoto ............. H01L 24/03
257/773
2018/0138056 A1\* 5/2018 Lee ......................... H01L 24/24
2020/0273817 A1\* 8/2020 Choi ................... H01L 21/4853

\* cited by examiner

METHOD OF MANUFACTURING CONNECTION STRUCTURE OF SEMICONDUCTOR CHIP AND METHOD OF MANUFACTURING SEMICONDUCTOR PACKAGE

CROSS-REFERENCE TO RELATED APPLICATION(S)

This application claims benefit of priority to Korean Patent Application No. 10-2019-0022013 filed on Feb. 25, 2019 in the Korean Intellectual Property Office, the disclosure of which is incorporated herein by reference in its entirety.

BACKGROUND

1. Field

The present disclosure relates to a method of manufacturing a connection structure of a semiconductor chip and a method of manufacturing a semiconductor package, and more particularly, to a method of manufacturing a connection structure of a semiconductor chip and a method of manufacturing a semiconductor package capable of preventing corrosion of a connection pad of the semiconductor chip.

2. Description of Related Art

A connection structure is a structure for electrically connecting a connection pad of a semiconductor chip to a printed circuit board (PCB) such as a mainboard of an electronic device.

A significant recent trend in the development of technology related to semiconductor chips has been reductions in the size of semiconductor chips, and in accordance with a rapid increase in demand for small-sized semiconductor chips, or the like, the implementation of a semiconductor chip, having a compact size while including a plurality of pins, has been demanded. In accordance with such a technical demand, recently, patterns and vias of an internal redistribution layer of a connection structure controlling a redistribution function of the semiconductor chip have been finely formed by a photolithography process.

Meanwhile, a photolithography process is a process of irradiating light to a reticle or a photomask on which a circuit pattern is drawn to expose a photosensitive insulating layer and removing portions of the photosensitive insulting layer by a developer to implement a desired pattern, and when the redistribution layer is formed on the connection pad of the semiconductor chip by the photolithography process, there is a problem that a developing agent, a cleaning agent, or the like, is in contact with an aluminum (Al) connection pad to cause corrosion of or damage to the connection pads.

SUMMARY

An aspect of the present disclosure is to provide a connection structure of a semiconductor chip and a method of manufacturing a semiconductor package capable of improving process efficiency and reducing a product defect rate by preventing corrosion of and damage to a connection pad in a process of forming a connection structure of a semiconductor chip and a semiconductor package process.

According to an aspect of the present disclosure, a method of manufacturing a connection structure of a semiconductor chip may be provided, in which contact between a chemical agent for forming a via hole and a connection pad is blocked in a process of forming a redistribution via or a connection structure.

According to an aspect of the present disclosure, a method of manufacturing a connection structure of a semiconductor chip may include: preparing a semiconductor chip comprising a first surface having a connection pad disposed thereon and a passivation layer covering the connection pad and the first surface on which the connection pad is not disposed, and a second surface opposing the first surface; forming an insulating layer on the first surface of the semiconductor chip, the insulating layer covering at least a portion of the passivation layer; forming a via hole penetrating through the insulating layer to expose at least a portion of the passivation layer; exposing at least a portion of the connection pad by removing the passivation layer exposed by the via hole; forming a redistribution via by filling the via hole with a conductive material; and forming a redistribution layer on the redistribution via and the insulating layer.

According to another aspect of the present disclosure, a method of manufacturing a semiconductor package may include: preparing a semiconductor chip having a first surface having a connection pad disposed thereon and a second surface opposing the first surface and including a passivation layer disposed on the first surface and covering the connection pad; forming an encapsulant on the second surface of the semiconductor chip, the encapsulant covering at least a portion of the semiconductor chip; forming an insulating layer on the first surface of the semiconductor chip, the insulating layer covering at least a portion of the passivation layer; forming a via hole penetrating through the insulating layer to expose at least a portion of the passivation layer; exposing at least a portion of the connection pad by removing the passivation layer exposed by the via hole; forming a redistribution via by filling the via hole with a conductive material; and forming a redistribution layer on the redistribution via and the insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward amounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Semiconductor Chip

A semiconductor chip may be an integrated circuit (IC) provided in an amount of several hundred to several million or more elements integrated in a single chip. The semiconductor chip 120 may be formed on the basis of an active wafer. In this case, a base material of a body 121 of the semiconductor chip 120 may be silicon (Si), germanium (Ge), gallium arsenide (GaAs), or the like.

Various circuits may be formed on the body 121. Connection pads 122 may electrically connect the semiconductor chip 120 to other components. A material of each of the connection pads 122 may be a conductive material such as aluminum (Al), or the like. An active surface of the semiconductor chip 120 refers to a surface of the semiconductor chip 120 on which the connection pads 122 are disposed, and an inactive surface of the semiconductor chip 120 refers to a surface of the semiconductor chip 120 opposing the active surface.

A passivation layer 123 covering at least portions of the connection pads 122 may be formed on the body 121, if necessary. The passivation layer 123 may be an oxide layer, a nitride layer, or the like, or be a double layer of an oxide layer and a nitride layer. An insulating layer (not illustrated), and the like, may further be disposed in other required positions.

The semiconductor chip 120 may be a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like, but is not necessarily limited thereto.

Figure 1:
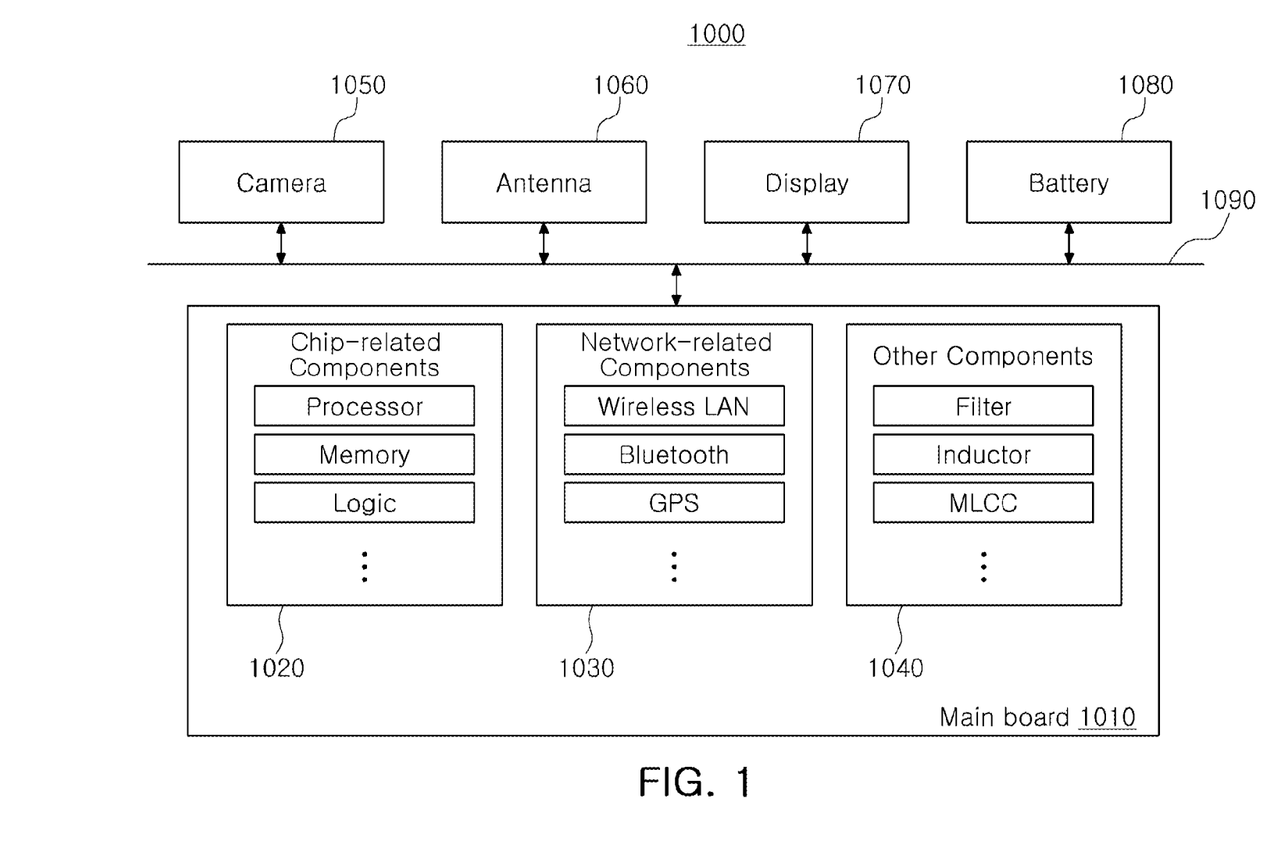
FIG. 1 is a schematic block diagram illustrating an example of an electronic device system in which a semiconductor chip may be used.

FIG. 1 is a schematic block diagram illustrating an example of an electronic device system in which a semiconductor chip may be used.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Connection Structure and Semiconductor Package

A connection structure refers to a structure including conductive patterns formed on one surface of a semiconductor chip in order to externally redistribute connection pad of the semiconductor chip in, for example, a semiconductor package, an interposer embedding the semiconductor chip therein, a mainboard, or the like.

Figure 2:
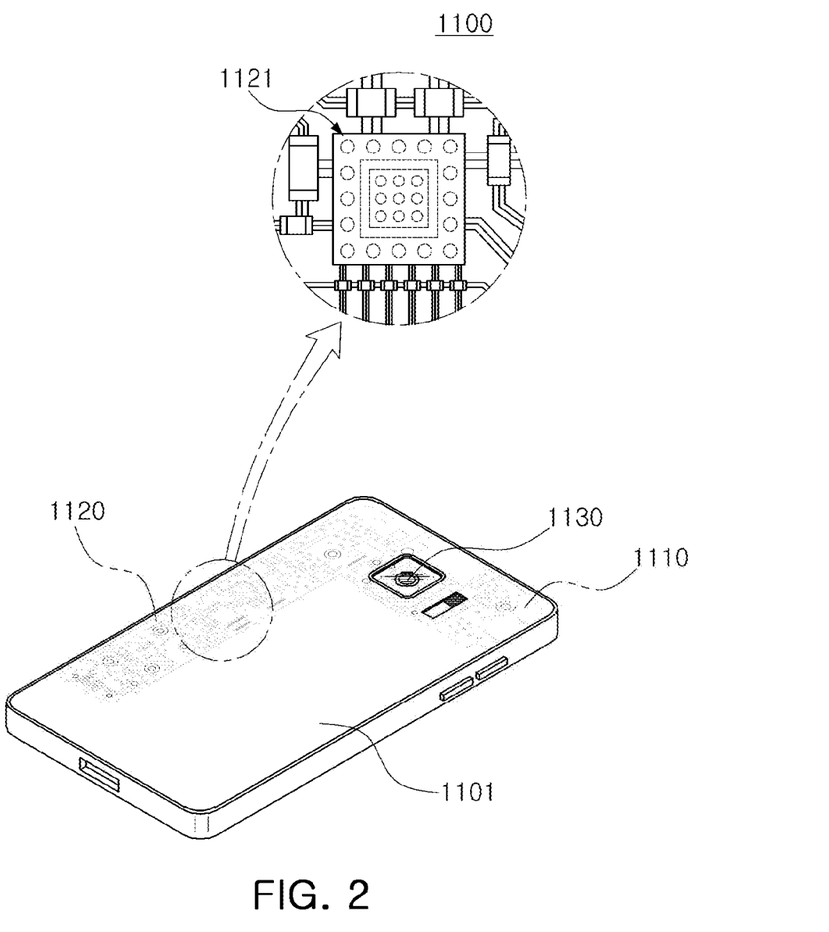
FIG. 2 is a schematic perspective view illustrating an example of a semiconductor package embedded in an electronic device.

FIG. 2 is a schematic perspective view illustrating an example of a semiconductor package embedded in an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

The fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate printed circuit board.

Figure 3:
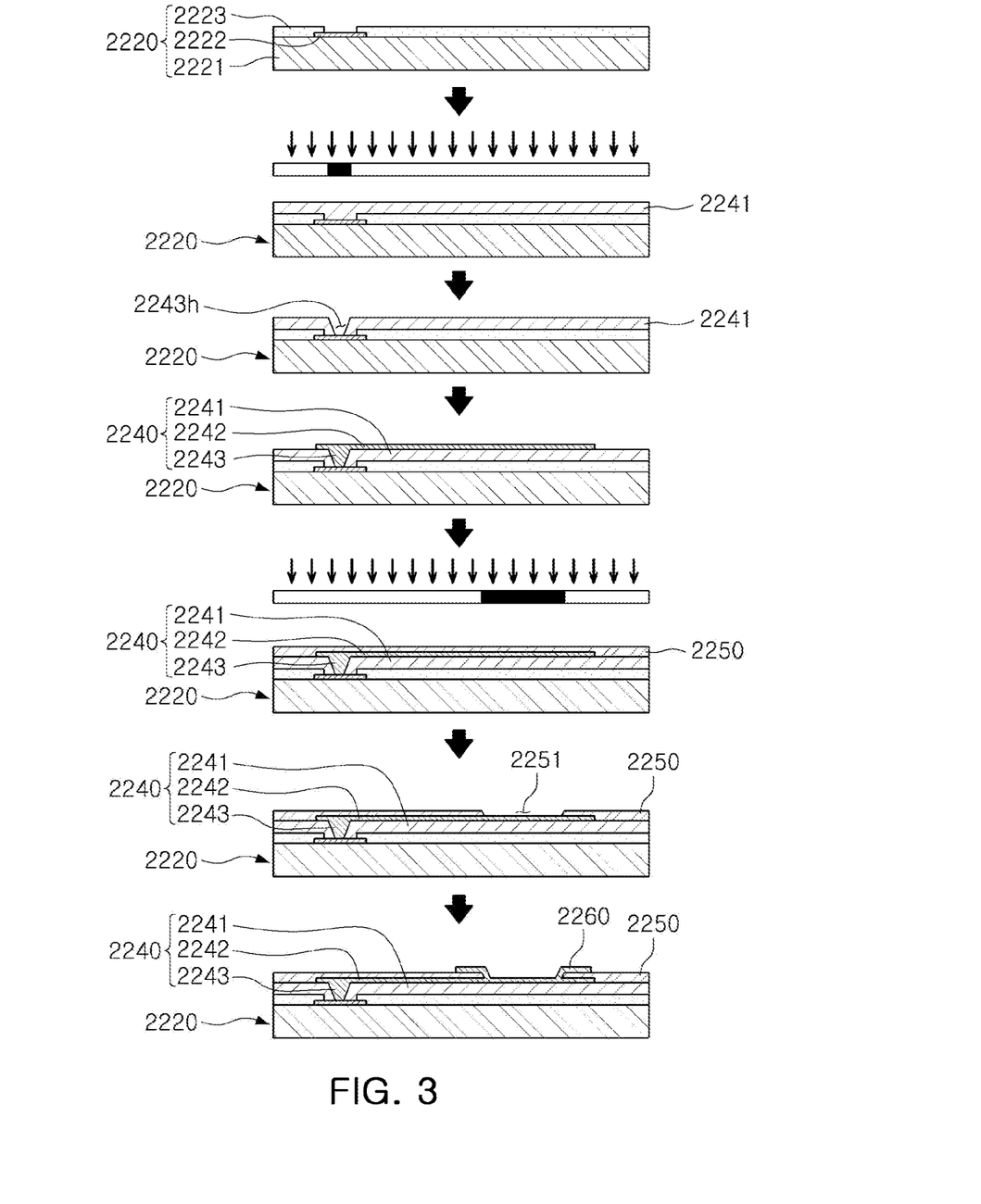
FIG. 3 is schematic cross-sectional views illustrating a process of forming a connection structure on a semiconductor chip.

FIG. 3 is schematic cross-sectional views illustrating a process of forming a connection structure on a semiconductor chip.

Referring to FIG. 3, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222.

The connection structure 2240 may be formed by forming an insulating layer 2241 on the semiconductor chip 2220 using an insulating material such as a photoimagable dielectric (PID), forming via holes 2243h opening the connection pads 2222, and then forming wiring patterns 2242 and vias 2243.

Then, a passivation layer 2250 protecting the connection structure 2240 may be formed, an opening 2251 may be formed, and an underbump metal layer 2260, or the like, may be formed. That is, a semiconductor package 2200 including, for example, the semiconductor chip 2220, the connection structure 2240, the passivation layer 2250, and the underbump metal layer 2260 may be manufactured through a series of processes.

FIGS. 4A through 4D are schematic cross-sectional views illustrating a damage process of a connection pad in a process of forming a via hole of the connection structure.

Figure 4A:
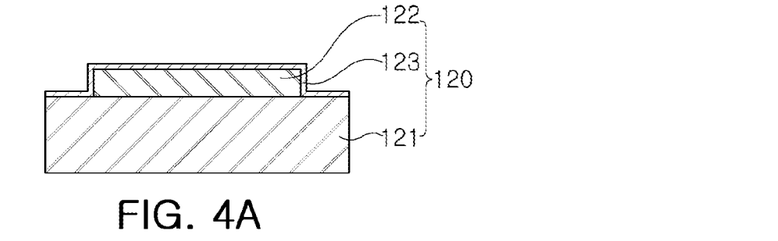
FIGS. 4A through 4D are schematic cross-sectional views illustrating a damage process of a connection pad in a process of forming a via hole of the connection structure.
Figure 4B:
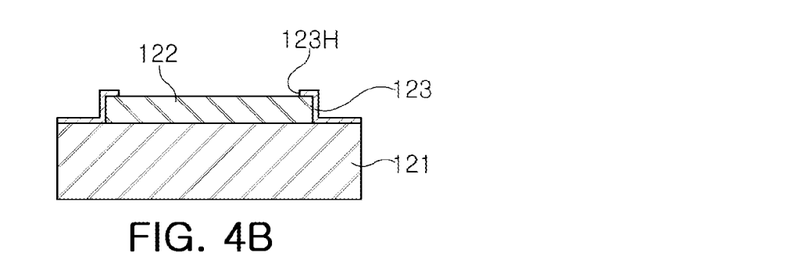
Figure 4C:
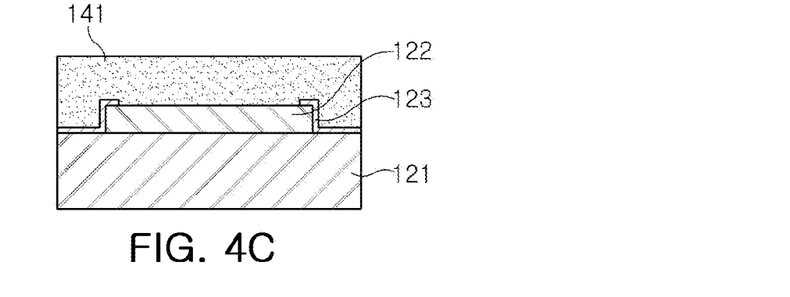
Figure 4D:
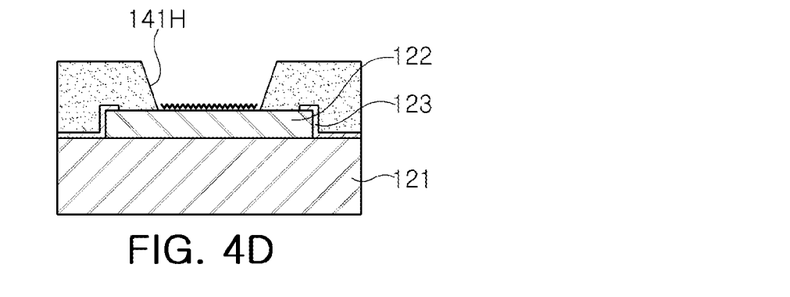

For example, referring to FIGS. 4A through 4D, an active surface of a semiconductor chip 120 in a bare state of FIG. 4A may include a body 121, a connection pad 122, and a passivation layer 123. In the related art, an opening 123H is formed by partially removing the passivation layer 123 in order to perform a function test of the semiconductor chip 120 on a wafer level as illustrated in FIG. 4B. In this case, a surface of an aluminum (Al) connection pad 122 exposed in a process of removing a portion of an insulating layer 141 covering the connection pad 122 in order to form a via hole 141H of FIGS. 4C and 4D is damaged by a developing agent, a cleaning agent, an etching agent, or the like.

FIGS. 5A through 5D are schematic cross-sectional views illustrating a method of manufacturing the connection structure for preventing damage to the connection pad of FIGS. 4A through 4D.

Figure 5A:
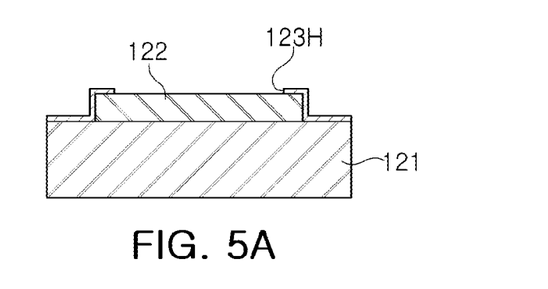
FIGS. 5A through 5D are schematic cross-sectional views illustrating a method of manufacturing the connection structure for preventing damage to the connection pad of FIGS. 4A through 4D.
Figure 5B:
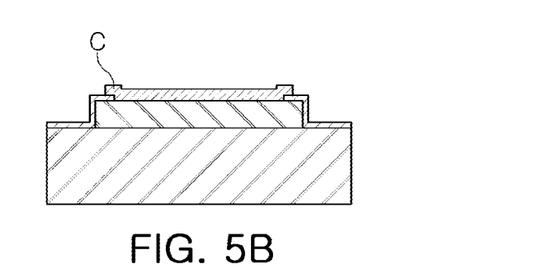
Figure 5C:
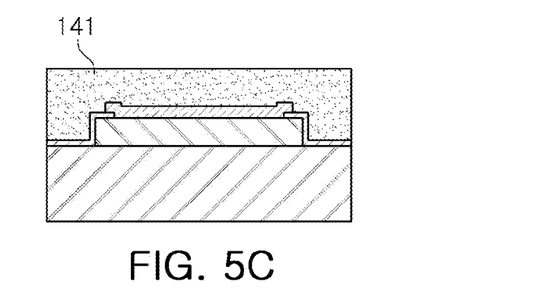
Figure 5D:
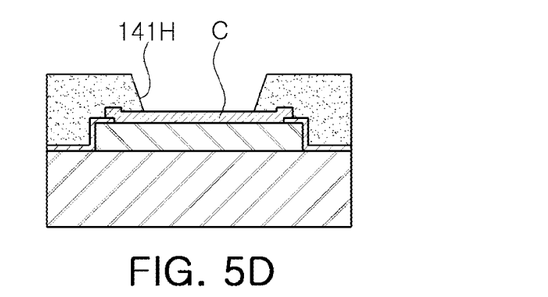

Referring to FIGS. 5A through 5D, in order to prevent corrosion of the connection pad, an opening 123H is formed in a passivation layer 123 of FIG. 5A, a function test of the connection pad 122 is performed, and a metal cap C covering an exposed surface of the connection pad 122 as illustrated in FIG. 5B is then formed. Therefore, contact between the cleaning agent, or the like, described above and the aluminum (Al) connection pad 122 in a process of forming a via hole 141H of FIGS. 5C and 5D may be blocked to prevent corrosion of the connection pad 122. However, a manufacturing cost and a lead time may be increased due to addition of a capping process using a metal such as copper (Cu), or the like.

Therefore, the present disclosure discloses a method of manufacturing a connection structure of a semiconductor chip and a method of manufacturing a semiconductor package capable of preventing corrosion of and damage to a connection pad of the semiconductor chip due to a chemical agent in a process of forming a via hole opening the connection pad without performing a process of forming a metal cap in forming a connection structure 140 redistributing the connection pad of the semiconductor chip.

Methods of manufacturing a connection structure and a semiconductor package according to various exemplary embodiments in the present disclosure will hereinafter be described in detail with reference to the drawings.

FIGS. 6A through 6E are schematic cross-sectional views illustrating a method of manufacturing a connection structure according to an exemplary embodiment in the present disclosure.

Figure 6A:
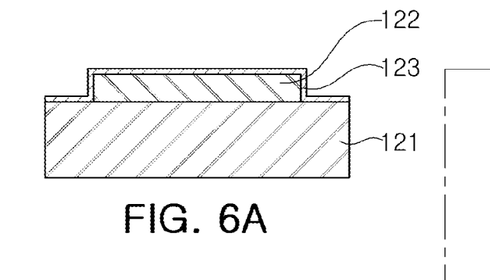
FIGS. 6A through 6E are schematic cross-sectional views illustrating a method of manufacturing a connection structure according to an exemplary embodiment in the present disclosure.
Figure 6B:
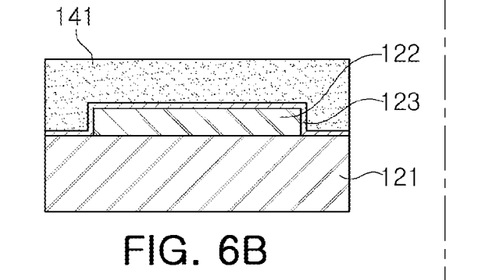
Figure 6C:
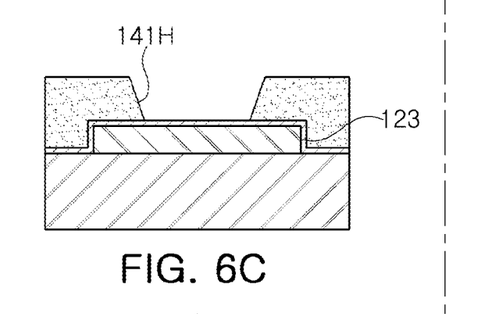
Figure 6D:
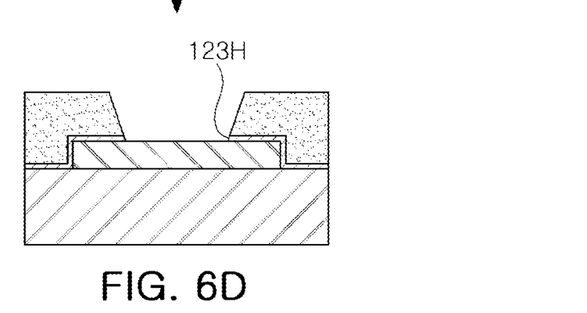
Figure 6E:
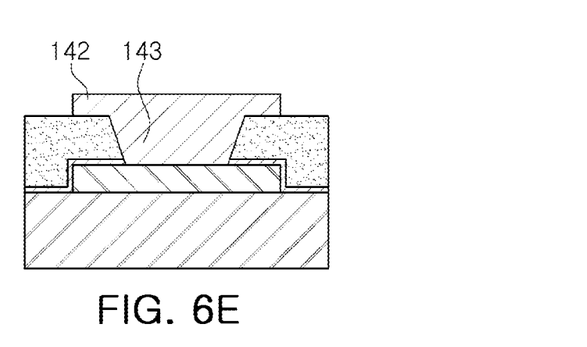

Referring to FIGS. 6A through 6E, a method of manufacturing a connection structure according to an exemplary embodiment in the present disclosure may include: preparing a semiconductor chip 120 having a first surface and a second surface opposing the first surface, a connection pad 122 disposed the first surface, and a passivation layer 123 disposed on the first surface and covering the connection pad 122 (FIG. 6A); forming an insulating layer 141 on the first surface of the semiconductor chip, the insulating layer 141 covering at least a portion of the passivation layer 123 (FIG. 6B); forming a via hole 141H penetrating through the insulating layer 141 to expose at least a portion of the passivation layer (FIG. 6C); exposing at least a portion of the connection pad 122 by removing the passivation layer 123 exposed by the via hole 141H (FIG. 6D); forming a redistribution via 143 by filling the via hole 141H with a conductive material; and forming a redistribution layer 142 on the redistribution via 143 and the insulating layer 141 (FIG. 6E).

That is, in the method of manufacturing a connection structure according to the exemplary embodiment, a process of forming the via hole 141H of FIGS. 6A through 6C may be performed in a state in which the passivation layer 123 of a bare chip is not removed. Then, as illustrated in FIG. 6D, the passivation layer 123 exposed by the via hole 141H may be removed to form an opening 123H exposing the connection pad 122.

Therefore, contact between various chemical agents for forming the via hole 141H and the connection pad 122 may be blocked by the passivation layer 123 included in the bare chip without performing a separate metal capping process, resulting in improvement of efficiency of a process of manufacturing the connection structure and reduction in a manufacturing cost and a lead time of a final product.

Particularly, when a problem such as a coating defect of the insulating layer 141, an exposure defect, or the like, occurs in a photolithography process for implementing a fine pattern, the photolithography process may be retried after the entire insulating layer 141 is removed without damage to the connection pad 122.

The respective processes of the method of manufacturing a connection structure of a semiconductor chip according to an exemplary embodiment in the present disclosure will hereinafter be described in detail.

In the preparing of the semiconductor chip 120, the semiconductor chip may be attached to a carrier (not illustrated), a tape (not illustrated), or the like, so that the connection pad of the semiconductor chip faces an upward direction, in order to form the connection structure on the connection pad 122. In this case, the semiconductor chip 120 may be in a package process in which a back surface or side surfaces of the semiconductor chip 120 are surrounded by an encapsulant or a component embedded substrate manufacturing process in which a back surface or side surfaces of the semiconductor chip 120 are embedded in a plurality of insulating substrates. However, the semiconductor chip 120 is not necessarily limited to being in an intermediate process such as the package process, or the like, and a process of encapsulating the semiconductor chip 120 may be performed simultaneously with a process of forming an insulating layer 141 to be described below.

The semiconductor chip 120 may include a body 121, the connection pad 122, and the passivation layer 123, and may be, for example, a semiconductor chip in a bare state in which the passivation layer 123 is not opened and covers an entire surface of the connection pad 122. In this case, a base material of the body 121 of the semiconductor chip 120 may be silicon (Si), germanium (Ge), gallium arsenide (GaAs), or the like. Various circuits may be formed on the body 121.

The connection pad 122 may electrically connect the semiconductor chip 120 to other components. A material of the connection pad 122 may be a conductive material such as aluminum (Al), or the like.

The passivation layer 123 may be an oxide layer, a nitride layer, or the like, or be a double layer of an oxide layer and a nitride layer. An insulating layer (not illustrated), and the like, may further be disposed in other required positions. The semiconductor chip 120 may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like, but is not necessarily limited thereto.

In the forming of the insulating layer 141, the insulating layer 141 may be applied to the body 121 of the semiconductor chip. In the present disclosure, the connection pad 122 is covered with the passivation layer 123, and the insulating layer 141 may thus be formed on a surface of the passivation layer 123. In addition, when other members such as an encapsulant of the semiconductor package, an insulating layer of a semiconductor chip embedded substrate, a core substrate, or the like, are present on opposite surfaces of the semiconductor chip, the insulating layer 141 may be not only formed on the body of the semiconductor chip, but may also extend onto the members present on the semiconductor chip.

A material of the insulating layer 141 may be an insulating material. In this case, the insulating material may be a photosensitive insulating material such as a photoimagable dielectric (PID) resin. That is, each of a plurality of insulating layers 141 may be a photosensitive insulating layer. When the insulating layer 141 has photosensitive properties, the insulating layer 141 may be formed to have a smaller thickness, and a fine pitch of the redistribution via 143 may be achieved more easily.

Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent. The number of insulating layers may be more than that illustrated in the drawing.

In the forming of the via hole 141H, the via hole 141 may penetrate through the insulating layer 141 covering the connection pad 122 to expose the connection pad 122. A method of forming the via hole 141H may be a physical or chemical method selected depending on a type of insulating layer 141, and is not particularly limited.

The via hole 141H may have a cylindrical shape, a tapered shape in which a diameter thereof is reduced toward one side, or the like.

Particularly, when the photosensitive insulating layer is used in order to implement a fine pitch, the via hole 141H may be formed by a photolithography process including exposure and development processes.

The photolithography process is a process of irradiating light a reticle or a photomask on which a circuit pattern is drawn to expose the photosensitive insulating layer applied to the semiconductor chip 120 and removing a portion of the photosensitive insulting layer by a developer to implement a desired pattern.

In general, in the photolithography process, the developer described above or a cleaning solution removing a residue may be in contact with the connection pad to cause corrosion of and damage to the connection pad. Therefore, in the present disclosure, the passivation layer 123 covering the connection pad may be maintained up to the forming of the via hole 141H to block the contact between a chemical agent for forming the via hole and the connection pad.

In the exposing of at least the portion of the connection pad 122, a portion of the passivation layer 123 protecting the connection pad from the chemical agent for forming the via hole may be removed to form an opening exposing the connection pad. Since the passivation layer 123 is in direct contact with the connection pad, the passivation layer 123 may be removed by dry etching that does not use the chemical agent.

For example, after the via hole is formed, the passivation layer 123 exposed by the via hole may be removed by plasma etching to form the opening 123H exposing the connection pad 122.

Therefore, sidewalls of the opening 123H may be connected to inner walls of the via hole 141H. In addition, a width of the opening 123H may be smaller than or the same as that of the via hole 141H.

That is, the via hole 141H and the opening 123H may have a tapered shape in which a diameter thereof is reduced from one end of the via hole 141H toward the opening 123H.

In the forming of the redistribution via 143 and the forming of the redistribution layer 142, conductive vias filling the via holes 141H and conductive patterns connecting the conductive vias to each other may be formed. A method of forming the redistribution via 143 and the redistribution layer 142 may be any known method such as electroplating, electroless plating, or the like, and is not particularly limited.

The redistribution vias 143 may electrically connect the redistribution layers 142 formed on different layers to each other, the connection pads 122, and the like, resulting in an electrical path in the connection structure 140.

A material of each of the redistribution vias 143 may be a conductive material such as copper (Cu), aluminum (Al), silver (Ag), tin (Sn), gold (Au), nickel (Ni), lead (Pb), titanium (Ti), or alloys thereof.

Each of the redistribution vias 143 may be completely filled with the conductive material or the conductive material may be formed along a wall of each of via holes. In addition, each of the redistribution vias 143 may have any shape known in the related art, such as a tapered shape, a cylindrical shape, and the like.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof.

The redistribution layers 142 may perform various functions depending on designs of corresponding layers. For example, the redistribution layers 142 may include ground (GND) pattern layers (not illustrated), and may further include power (PWR) patterns, signal (S) patterns, and the like. Here, the signal (S) patterns may include various signals such as data signals, or the like except for ground (GND) signals, power (PWR) signals, or the like. In addition, the redistribution layers 142 may include via pad patterns.

Although not obviously illustrated, the number of redistribution layers 142 may be more than or less than that illustrated in the drawing.

Meanwhile, after the connection structure 140 is formed, processes of forming electrical connection metals 150 for physical and electrical connection to an external substrate such as a mainboard, or the like, and underbump metals (not illustrated) on one surface of the connection structure 140 may be sequentially performed.

In addition, processes of forming other components such as a semiconductor package, a semiconductor chip embedded substrate, and the like, may be added before and after the method of forming a connection structure according to the exemplary embodiment.

FIGS. 7A through 7G are schematic cross-sectional views illustrating a method of manufacturing a connection structure according to another exemplary embodiment in the present disclosure.

Figure 7A:
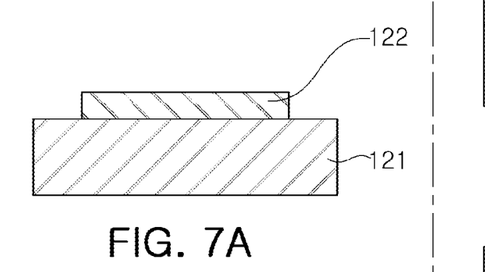
FIGS. 7A through 7G are schematic cross-sectional views illustrating a method of manufacturing a connection structure according to another exemplary embodiment in the present disclosure.
Figure 7B:
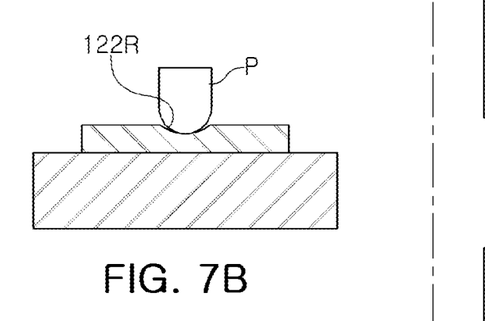
Figure 7C:
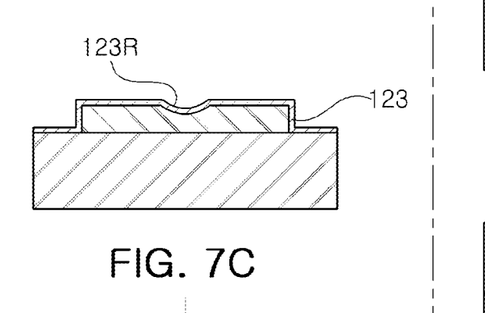
Figure 7D:
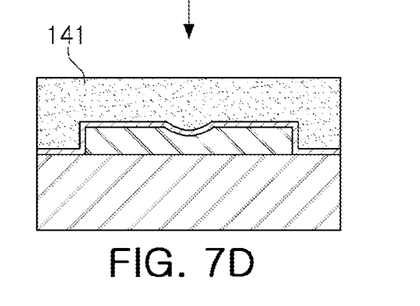
Figure 7E:
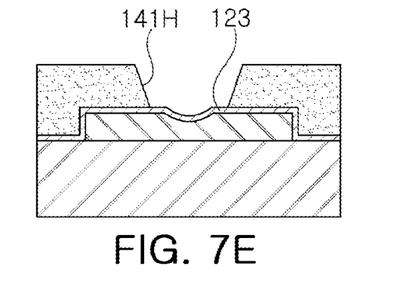
Figure 7F:
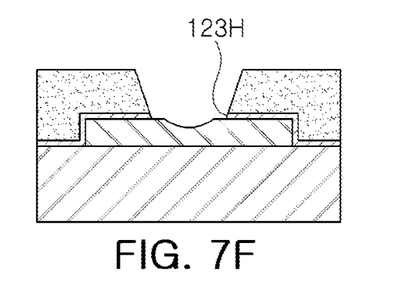
Figure 7G:
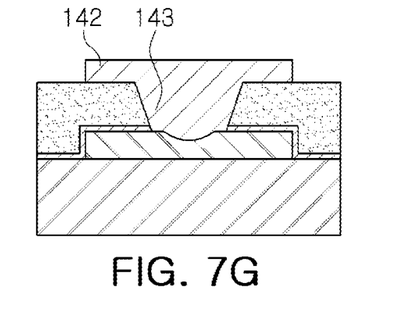

Referring to FIGS. 7A through 7G, a method of manufacturing a connection structure according to another exemplary embodiment may further include, before the preparing of the semiconductor chip 120 including the passivation layer 123 in the method of manufacturing a connection structure according to the exemplary embodiment, a performing a function test of the semiconductor chip through the connection pad 122 of the semiconductor chip (FIG. 7B) and forming the passivation layer 123 covering the connection pad (FIG. 7C).

In detail, as illustrated in FIGS. 7A and 7B, the function test of the semiconductor chip may be performed by bringing a probe P into contact with the connection pad 122 before the passivation layer 123 is formed.

Then, the passivation layer 123 of FIG. 7C may be formed. The passivation layer 123 may be an oxide layer, a nitride layer, or the like, or be a double layer of an oxide layer and a nitride layer. In addition, an insulating layer (not illustrated), and the like, may further be disposed in other required positions.

The reason why the function test is performed before the passivation layer 123 is formed in the method of manufacturing a connection structure according to another exemplary embodiment may be to prevent the connection pad 122 from being damaged in a process of forming the via hole without additionally performing a process of forming a metal cap in a case of opening the passivation layer 123 before forming the via hole 141H in order to perform the function test of the semiconductor chip.

Meanwhile, when the function test of the semiconductor chip is performed, a recess 122R may be formed in a surface of the connection pad 122 using the probe P, and the passivation layer 123 may then be formed to be closely adhered to the surface of the connection pad 122, such that at least a portion of the passivation layer 123 may have a round portion 123R corresponding to the recess 122R.

The round portion 123R may preserve the recess 122R of the connection pad 122 in a process of forming a via hole 141H and an opening 123H of FIGS. 7D through 7G to increase a contact area between the via 143 filling the via hole 141H and the connection pad 122, resulting in improvement of connection reliability between the connection pad 122 and the redistribution layer 142.

Other components overlap those described in the method of manufacturing a connection structure according to the exemplary embodiment illustrated in FIGS. 6A through 6E, and a detailed description thereof is thus omitted.

Figure 8:
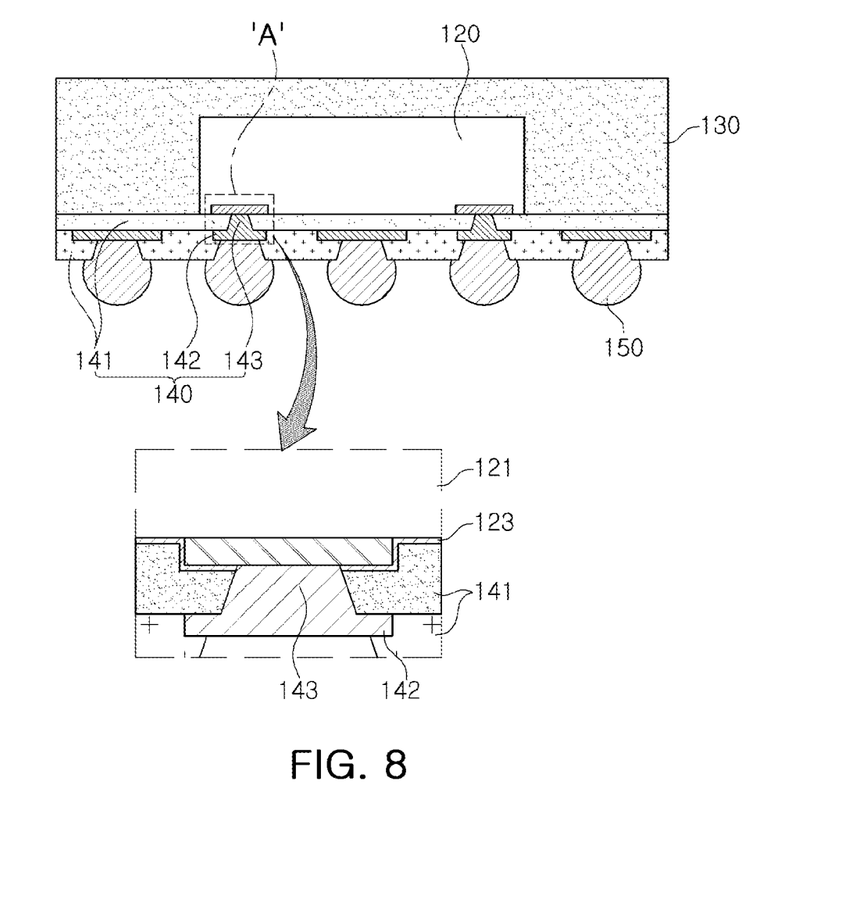
FIG. 8 is a schematic cross-sectional view illustrating a semiconductor package to which a method of manufacturing a semiconductor package according to an exemplary embodiment in the present disclosure is applied.

FIG. 8 is a schematic cross-sectional view illustrating a semiconductor package to which a method of manufacturing a semiconductor package according to an exemplary embodiment in the present disclosure is applied.

A semiconductor package of FIG. 8 may be manufactured by the method of manufacturing a semiconductor package including: preparing a semiconductor chip 120 having a first surface having a connection pad disposed thereon and a second surface opposing the first surface and including a passivation layer 123 disposed on the first surface and covering the connection pad; forming an encapsulant 130 on the second surface of the semiconductor chip 120 wherein the encapsulant 130 covers at least a portion of the semiconductor chip; forming an insulating layer 141 on the first surface of the semiconductor chip 120, the insulating layer 141 covering at least a portion of the passivation layer 123; forming a via hole 141H penetrating through the insulating layer 141 to expose at least a portion of the passivation layer 123; exposing at least a portion of the connection pad by removing the passivation layer 123 exposed by the via hole 141H; forming a redistribution via 143 by filling the via hole 141H with a conductive material; and forming a redistribution layer 142 on the redistribution via 143 and the insulating layer 141.

Referring to region "A" of FIG. 8, in the semiconductor package manufactured by the method of manufacturing a semiconductor package according to the exemplary embodiment, opposite side surfaces of the redistribution via 143 may be in contact with the passivation layer 123. The reason is that the via hole filled with the redistribution via 143 is formed and only a portion of the passivation layer 123 exposed by the via hole is then removed.

Meanwhile, the method of manufacturing a semiconductor package according to the exemplary embodiment may include forming the encapsulant 130 on the second surface of the semiconductor chip 120, the encapsulant 130 covering at least a portion of the semiconductor chip 120.

The encapsulant 130 may encapsulate the semiconductor chip 120. An encapsulation form of the encapsulant 130 is not particularly limited, and may be a form in which the encapsulant 130 surrounds at least a portion of the semiconductor chip 120. For example, the encapsulant 130 may cover at least a portion of an inactive surface of the semiconductor chip 120 and cover at least portions of side surfaces of the semiconductor chip 120.

The encapsulant 130 may include an insulating material. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as Ajinomoto Build-up Film (ABF), FR-4, Bismaleimide Triazine (BT), or the like.

Alternatively, an epoxy molding compound (EMC), a photoimagable encapsulant (PIE), or the like, may be used as the insulating material. Alternatively, a material in which an insulating resin such as a thermosetting resin or a thermoplastic resin is impregnated in an inorganic filler and/or a core material such as a glass fabric may also be used as the insulating material.

Other components overlap those described in the method of manufacturing a connection structure according to the exemplary embodiment illustrated in FIGS. 6A through 6E, and a detailed description thereof is thus omitted.

Figure 9:
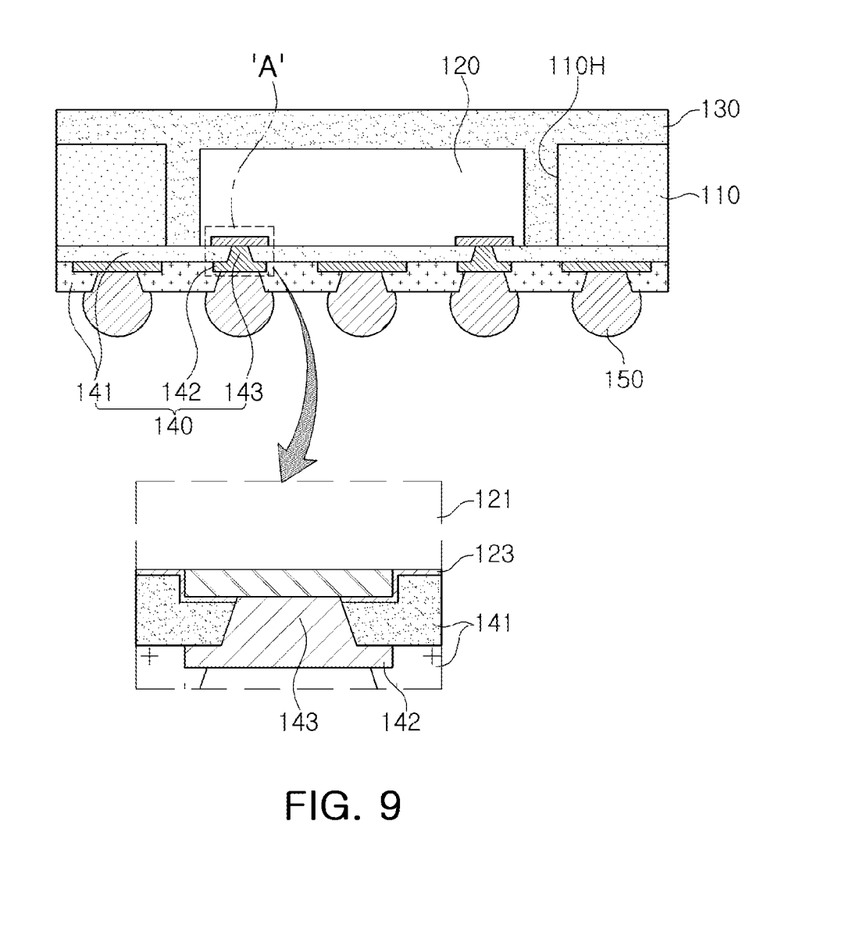
FIG. 9 is a schematic cross-sectional view illustrating a semiconductor package to which a method of manufacturing a semiconductor package according to another exemplary embodiment in the present disclosure is applied.

FIG. 9 is a schematic cross-sectional view illustrating a semiconductor package to which a method of manufacturing a semiconductor package according to another exemplary embodiment in the present disclosure is applied.

A semiconductor package of FIG. 9 may be manufactured by the method of manufacturing a semiconductor package including: preparing a frame 110 having a through-hole 110H; preparing a semiconductor chip 120 having a first surface having a connection pad disposed thereon and a second surface opposing the first surface and including a passivation layer 123 disposed on the first surface and covering the connection pad; disposing the semiconductor chip 120 in the through-hole 110H; forming an encapsulant 130 on one surface of the frame 110 and the second surface of the semiconductor chip 120, the encapsulant 130 covering at least portions of each of the frame and the semiconductor chip; forming an insulating layer 141 on the other surface of the frame 110 and the first surface of the semiconductor chip 120, the insulating layer 141 covering at least portions of the frame 110 and the passivation layer 123; forming a via hole 141H penetrating through the insulating layer 141 to expose at least portion of the passivation layer 123; exposing at least a portion of the connection pad by removing the passivation layer 123 exposed by the via hole 141H; forming a redistribution via 143 by filling the via hole 141H with a conductive material; and forming a redistribution layer 142 on the redistribution via 143 and the insulating layer 141.

Referring to region "A" of FIG. 9, in the semiconductor package manufactured by the method of manufacturing a semiconductor package according to another exemplary embodiment, opposite side surfaces of the redistribution via 143 may be in contact with the passivation layer 123. The reason is that the via hole filled with the redistribution via 143 is formed and only a portion of the passivation layer 123 exposed by the via hole is then removed.

Meanwhile, the method of manufacturing a semiconductor package according to another exemplary embodiment may include preparing the frame 110 having the through-hole 110H and forming the encapsulant 130 on one surface of the frame and the second surface of the semiconductor chip, the encapsulant 130 covering at least portions of each of the frame and the semiconductor chip.

The frame 110 may improve rigidity of the semiconductor package depending on certain materials, and serve to secure uniformity of a thickness of the encapsulant 130.

The frame 110 may have at least one through-hole 110H. The through-hole 110H may penetrate through the frame 110, and the semiconductor chip 120 may be disposed in the through-hole 110H.

The semiconductor chip 120 may be disposed to be spaced apart from walls of the through-hole 110H by a predetermined distance, and may be surrounded by the walls of the through-hole 110H. However, such a form is only an example and may be variously modified to have other forms, and the frame 110 may perform another function depending on such a form.

The frame 110 may be omitted, if necessary, but it may be more advantageous in securing board level reliability that the semiconductor package 100 includes the frame 110.

The encapsulant 130 may fill at least portions of the through-hole 110H and encapsulant the semiconductor chip 120. An encapsulation form of the encapsulant 130 is not particularly limited, and may be a form in which the encapsulant 130 surrounds at least portions of the semiconductor chip 120. For example, the encapsulant 130 may cover at least portions of the frame 110 and the inactive surface of the semiconductor chip 120, and fill at least portions of spaces between walls of the through-hole 110H and the side surfaces of the semiconductor chip 120.

Other components overlap those described in the method of manufacturing a connection structure according to the exemplary embodiment illustrated in FIGS. 6A through 6E, and a detailed description thereof is thus omitted.

As set forth above, according to an exemplary embodiment in the present disclosure, a method of manufacturing a connection structure of a semiconductor chip and a method of manufacturing a semiconductor package capable of improving process efficiency and reducing a product defect rate by preventing corrosion of and damage to a connection pad in a process of forming a connection structure of a semiconductor chip and a semiconductor package process may be provided.

While exemplary embodiments have been shown and described above, it will be apparent to those skilled in the art that modifications and variations could be made without departing from the scope of the present invention as defined by the appended claims.

What is claimed is:

1. A method of manufacturing a connection structure of a semiconductor chip, comprising:
   performing a function test of a semiconductor chip through a connection pad of the semiconductor chip;
   forming a passivation layer covering the connection pad;
   preparing the semiconductor chip having a first surface having the connection pad disposed thereon and a second surface opposing the first surface and including the passivation layer disposed on the first surface and covering the connection pad;
   forming an insulating layer on the first surface of the semiconductor chip, the insulating layer covering at least a portion of the passivation layer;
   forming a via hole penetrating through the insulating layer to expose at least a portion of the passivation layer;
   exposing at least a portion of the connection pad by removing the passivation layer exposed by the via hole;
   forming a redistribution via by filling the via hole with a conductive material; and
   forming a redistribution layer on the redistribution via and the insulating layer.

2. The method of claim 1, wherein in the preparing of the semiconductor chip, the connection pad includes aluminum (Al).

3. The method of claim 1, wherein in the preparing of the semiconductor chip, the passivation layer includes an oxide layer, a nitride layer, or a double layer of an oxide layer and a nitride layer.

4. The method of claim 1, wherein in the forming of the insulating layer, the insulating layer is a photosensitive insulating layer.

5. The method of claim 1, wherein the via hole is formed by a photolithography process.

6. The method of claim 1, wherein the forming of the via hole is performed so that an inner wall of the via hole has a tapered or cylindrical structure.

7. The method of claim 1, wherein in the exposing of at least a portion of the connection pad, the passivation layer is removed by dry etching.

8. The method of claim 1, wherein in the exposing of at least a portion of the connection pad, the passivation layer is removed so that a sidewall thereof has an opening connected to an inner wall of the via hole.

9. The method of claim 8, wherein a width of the opening is smaller than or equal to that of the via hole.

10. The method of claim 1, wherein in the performing of the function test of the semiconductor chip, a recess is formed in a surface of the connection pad.

11. The method of claim 1, wherein in the forming of the passivation layer, the passivation layer is closely adhered to a surface of the connection pad.

12. The method of claim 11, wherein the passivation layer has a round portion closely adhered to a recess of the connection pad.

13. A method of manufacturing a semiconductor package comprising:
performing a function test of a semiconductor chip through a connection pad of the semiconductor chip;
forming a passivation layer covering the connection pad;
preparing the semiconductor chip having a first surface having the connection pad disposed thereon and a second surface opposing the first surface and including the passivation layer disposed on the first surface and covering the connection pad;
forming an encapsulant on the second surface of the semiconductor chip, the encapsulant covering at least a portion of the semiconductor chip;
forming an insulating layer on the first surface of the semiconductor chip, the insulating layer covering at least a portion of the passivation layer;
forming a via hole penetrating through the insulating layer to expose at least a portion of the passivation layer;
exposing at least a portion of the connection pad by removing the passivation layer exposed by the via hole;
forming a redistribution via by filling the via hole with a conductive material; and
forming a redistribution layer on the redistribution via and the insulating layer.

14. The method of claim 1, wherein the redistribution via is formed of a conductive material.

* * * * *